(12) United States Patent
Coddé et al.

(10) Patent No.: US 11,204,205 B2
(45) Date of Patent: Dec. 21, 2021

(54) HEAT SINK AND METHOD FOR PRODUCING SAME

(71) Applicant: DIABATIX NV, Leuven (BE)

(72) Inventors: Joris Coddé, Leuven (BE); Lieven Vervecken, Oud-Heverlee (BE)

(73) Assignee: DIABATIX NV, Leuven (BE)

( * ) Notice: Subject to any disclaimer, the term of this patent is extended or adjusted under 35 U.S.C. 154(b) by 95 days.

(21) Appl. No.: 16/614,277

(22) PCT Filed: May 18, 2018

(86) PCT No.: PCT/EP2018/063232
§ 371 (c)(1),
(2) Date: Nov. 15, 2019

(87) PCT Pub. No.: WO2018/211130
PCT Pub. Date: Nov. 22, 2018

(65) Prior Publication Data
US 2021/0156627 A1    May 27, 2021

(30) Foreign Application Priority Data
May 18, 2017    (EP) ..................................... 17171845

(51) Int. Cl.
*F28F 3/12*    (2006.01)

(52) U.S. Cl.
CPC ............ *F28F 3/12* (2013.01); *F28F 2210/02* (2013.01)

(58) Field of Classification Search
CPC ...... F28F 3/12; F28F 2210/02; F28F 2250/04; F28F 1/16; H01L 23/473
(Continued)

(56) References Cited

U.S. PATENT DOCUMENTS 5,457,342 A * 10/1995 Herbst, II ............... H01L 23/38
257/712
8,199,505 B2 * 6/2012 Dede ................... H01L 23/4735
361/702
(Continued)

FOREIGN PATENT DOCUMENTS

DE    10 2011 118 483 A1    5/2013

OTHER PUBLICATIONS

"TCPT-2006-096.R2: Micro Scale pin fin Heat Sinks—Parametric Performance Evaluation Study", Jan. 2008, pp. 1-11.
(Continued)

*Primary Examiner* — Justin M Jonaitis
(74) *Attorney, Agent, or Firm* — Stein IP, LLC

(57) ABSTRACT

The Invention pertains to a heat sink comprising a substantially planar solid slab, provided with a plurality of fluid flow channels, said plurality of fluid flow channels being formed so as to channel a coolant from an inlet to an outlet of said slab, wherein said plurality of channels includes at least two main channels interconnected by at least a plurality of bridging channels that do not branch out further between their respective points of attachment to said main channels, wherein said bridging channels have a cross section that locally increases in the direction of flow, and wherein said bridging channels have a cross section that locally decreases in the direction of flow, downstream of said local increase in cross section. The invention also pertains to a method for producing a heat sink.

23 Claims, 5 Drawing Sheets

(58) Field of Classification Search
USPC .................................... 165/80.4, 80.5, 170
See application file for complete search history.

(56) References Cited

U.S. PATENT DOCUMENTS

| | | | | |
|---|---|---|---|---|
| 9,423,192 | B2* | 8/2016 | Tsoi | F28F 21/084 |
| 2009/0139693 | A1* | 6/2009 | Qu | F28F 3/048 |
| | | | | 165/80.4 |
| 2009/0145581 | A1 | 6/2009 | Hoffman et al. | 165/80.3 |
| 2010/0122798 | A1* | 5/2010 | Hashimoto | F28F 21/02 |
| | | | | 165/104.21 |
| 2012/0018137 | A1* | 1/2012 | Chang | F28D 15/0233 |
| | | | | 165/185 |
| 2012/0243180 | A1* | 9/2012 | Lee | F28F 13/08 |
| | | | | 361/702 |
| 2014/0091453 | A1 | 4/2014 | Mori et al. | 257/712 |
| 2016/0029516 | A1* | 1/2016 | Sever | H01L 23/473 |
| | | | | 165/80.3 |

OTHER PUBLICATIONS

International Search Report dated Nov. 2, 2018, issued by the European Patent Office in corresponding application PCT/EP2018/063232.

Notification of Transmittal of the International Search Report and the Written Opinion of the International Searching Authority, or the Declaration dated Nov. 2, 2018, issued by the European Patent Office in corresponding PCT/EP2018/063232.

Extended European Search Report dated Nov. 7, 2017, issued by the European Patent Office in corresponding application EP 17171845.5.

Ali Koşar et al., "TCPT-2006-096.R2: Micro Scale pin fin Heat Sinks—Parametric Performance Evaluation Study", Oct. 26, 2006, pp. 1-10.

International Preliminary Report on Patentability dated Nov. 19 2019, issued by the International Bureau of WIPO in corresponding application PCT/EP2018/063232.

* cited by examiner

HEAT SINK AND METHOD FOR PRODUCING SAME

CROSS-REFERENCE TO RELATED APPLICATIONS

This is a National Stage of International Application No. PCT/EP2018/063232 filed May 18, 2018, which claims the benefit of priority to European Application No. 17171845.5, filed May 18, 2017, in the European Patent Office, the disclosures of which are incorporated herein in their entireties by reference.

FIELD OF THE INVENTION

The present invention pertains to the field of heat sinks.

BACKGROUND

A heat sink is a physical construction that transfers heat generated by another device to a fluid medium, which is subsequently led away from the device.

The cooling of components is a recurring problem in industry. One reason for this is that, very often, the lifetime of a component is strongly dependent on the operating temperature. Therefore, active cooling is applied to the components in an attempt to keep the maximal temperature below a certain limit temperature. Examples of such components range from lasers to engines and power electronics. Also, products may require cooling during production. This is the case for instance for casting. By applying active cooling during casting, the cycle time is reduced with an increased productivity as a result. However, inadequate cooling can result in a reduced product quality.

A liquid cold plate is essentially a heat sink through which a liquid coolant flows. The various heat sources are mounted on the cold plate. The common design for such a generic cold plate is a metal plate with one serpentine cooling channel which runs over all heat sources. However, in traditional serpentine heat sinks, the fluid heats up along the serpentine channel, which has a detrimental effect on the cooling near the end of the channel.

The doctoral dissertation "Optimal Heat Sink Design for Liquid Cooling of Electronics" by T. Van Oevelen (KU Leuven, November 2014), develops advanced numerical design methods for micro heat sinks. Two approaches are discussed: shape optimization of single microchannels and topology optimization of heat sinks.

The topology optimization problem is solved by optimally controlling a fictitious porosity that is used in the used two-dimensional model to distinguish solid material from fluid. While this work improves on the serpentine heat sinks in theory, for instance in terms of reducing thermal gradients, the use of a model in which the "solid" fraction of the plate is porous and the possibility of using essentially infinitely narrow channels renders the results impractical for real-world manufacturing.

German patent application publication no. DE 10 2011 118483 A1 in the name of Volkswagen DE discloses a heat exchanger comprising a casing whose longitudinal direction is oriented by a leading side to a rear side. A structured transfer surface of a solid portion has a planar base surface having mutually spaced transfer elements. The transfer elements are aligned as projections parallel to the base. An oriented cross-section of base is set with different widths perpendicular to longitudinal direction and different lengths parallel to longitudinal direction such that maximum length has greater extension than maximum width.

US patent application publication no. US 2014/091453 A1, assigned to TOYOTA JIDOSHOKKI KK, discloses a cooling device including a base and a plurality of radiator fins. The base includes an exterior, an interior, an inlet, and an outlet. A heat generation element is connected to the exterior of the base. The radiator fins are located near the heat generation element in the interior of the base. The radiator fins are arranged from the inlet to the outlet. Each radiator fin has a sidewise cross-section with a dimension in a flow direction of the cooling medium and a dimension in a lateral direction orthogonal to the flow direction of the cooling medium. The dimension in the flow direction is longer than the dimension in the lateral direction. The radiator fins are separated from one another by a predetermined distance in the lateral direction.

US patent application publication no. US 2009/145581 A1 in the name of Paul Hoffman et al. discloses a non-linear fin heat sink for dissipating/removing heat uniformly from a device, where the heat generation is non-uniform over that device, while also providing a small and relatively lightweight heat sink. The heat sink has extended surface protrusions that are allegedly optimally shaped in recognition of convective heat transfer, conductive heat transfer, and flow resistance allowing the heat sink to offset the temperature rise of a coolant media and provide enhanced cooling for the coolant temperature, deliver optimized cooling efficiency per the local physical properties of the coolant media, be used with a fluid for effectuating heat transfer; either liquid coolant, gas coolant or a combination thereof. Furthermore, the heat sink features turbulence enhancement of the coolant stream by a fin array through which coolant stream passes, such fin array featuring a non-linear shape, spacing, and height pattern to provide optimal cooling while simultaneously reducing volume and flow resistance.

An article by A. Kosar et al., "TCPT-2006-096.R2: Micro Scale pin fin Heat Sinks—Parametric Performance Evaluation Study", *IEEE Transactions on Components and Packaging Technologies*, vol. 30, no. 4, presents an experimentally conducted parametric study of heat transfer and pressure drop associated with forced flow of deionized water over five micro pin fin heat sinks of different spacing, arrangements, and shapes. Nusselt numbers and friction factors were obtained over Reynolds numbers ranging from 14 to 720. The thermal and hydraulic results were obtained to evaluate and compare the heat sinks performances at fixed mass flowrate, fixed pressure drop, and fixed pumping power. Two distinct regions of the Nusselt number dependency on the Reynolds number separated by a critical Reynolds number have been identified for unstreamlined pin fin devices while the streamlined device showed no slope change. The effects of spacing, shape of pin fins, and arrangement on friction factor and heat transfer were in agreement with existing literature. The results indicate that utilizing streamlined pin fin heat sinks can significantly enhance the thermal-hydraulic performance of the heat sink, but only at moderate Reynolds numbers.

The existing solutions do not appear to provide a satisfactory tradeoff between thermal efficiency and pressure drop. Hence, there is still a need for improved heat sinks.

SUMMARY

Embodiments of the present invention present new cooling solutions enabled by topology optimization, for use inter alia in industrial settings.

According to an embodiment of the present invention, there is provided a heat sink comprising a substantially planar solid slab, provided with a plurality of fluid flow channels, said plurality of fluid flow channels being formed so as to channel a coolant from an inlet to an outlet of said slab, wherein said plurality of channels includes at least two main channels interconnected by at least a plurality of bridging channels that do not branch out further between their respective points of attachment to said main channels, wherein said bridging channels have a cross section that locally increases in the direction of flow, and wherein said bridging channels have a cross section that locally decreases in the direction of flow, downstream of said local increase in cross section.

The term "slab" is used to refer to a plate-like structure, having substantially parallel top and bottom faces and a circumferential edge, whereby the top and/or bottom faces are to be brought into contact with the heat sources from which heat is to be removed. The circumferential edge typically defines a rectangular shape, although other polygonal and non-polygonal shapes may be preferred depending on the application.

The term "main channels" is used herein to denote stretches of channel that are interconnected by other channels. The heat sink according to the present invention may have two or more main channels, which typically but not necessarily exhibit some symmetry in their configuration.

Some or all of the channels interconnecting a pair of main channels may be considered "bridging channels" in the sense of the claimed invention, meaning that they are provided with a cross section that locally increases in the direction of flow and locally decreases in the direction of flow, downstream of said local increase in cross section, and that they do not branch out further between their respective points of attachment to the main channels.

The present invention is based inter alia on the surprising insight of the inventors that by providing bridging channels that have a cross section that locally increases in the direction of flow, a more optimal balance can be struck between the pressure drop and the amount of fluid flow. As the allowable pressure drop is typically dictated by external conditions (e.g., the characteristics of the coolant pump that is to be used), it is a highly desirable property of a heat sink that it maximizes the fluid flow (and thus the heat transport) for that particular given pressure. While literature suggests, on theoretical considerations, the use of channels that narrow down in the direction of flow, surprisingly good flow rates have been obtained by going against this suggestion and using bridging channels that present a local widening stage.

In addition, the bridging channels narrow again downstream of the aforementioned restriction, prior to reaching the main channel towards which they transport fluid. The inventors have found that this arrangement allows for a broader "mid-section" of the bridging channels, which reduces the pressure drop over the channel. In particular, the combination of the broader "mid-section" with the restrictions at the inflow and outflow portions of the bridging channel, allows for an optimal design trade-off between the pressure drop over the channel and the efficiency of the heat evacuation.

In an embodiment of the heat sink according to the present invention, said main channels have a minimum cross section that is greater than a maximum cross section of its bridging channels.

In an embodiment of the heat sink according to the present invention, said main channels follow a substantially straight trajectory for at least ⅓, preferably at least ½, more preferably at least ⅔, or most preferably even at least ¾ of a length of the outer dimension of the heat sink in the direction of flow.

A main channel may be composed of several substantially straight segments of a substantial length, for example of a length meeting the minimum lengths listed above.

These arrangements allow for designs wherein the main channels define the overall flow of the cooling fluid through the slab, whereby the bridging channels locally modulate the amount of heat that may be absorbed and evacuated per unit of area.

In an embodiment of the heat sink according to the present invention, said local increase in cross section starts from the point of connection with one of said main channels that is situated upstream of said bridging channel.

In this embodiment, the bridging channels exhibit a cross-sectional restriction at the point where they are connected to the main channel from which they receive their flow. The inventors have found that such a restriction is a particularly effective feature to modulate the mass flow rate through such bridging channels, thus improving the heat exchange at these points and the heat evacuation.

In an embodiment of the heat sink according to the present invention, portions of said solid slab remaining between said fluid flow channels form islands that do not exhibit multiple symmetry axes, and wherein different island shapes occur.

In this embodiment, the islands (also referred to as "fins") show some geometric variation, allowing for a variation of the heat transfer characteristics along the overall path of the cooling fluid.

In an embodiment of the heat sink according to the present invention, said inlet and/or said outlet are provided on the circumference of said slab.

While it is equally possible to have the inlet and/or the outlet on major faces of the substantially planar solid slab, it is an advantage of providing them on the circumference that the entire heat sink remains substantially flat, thus allowing for a more efficient use of space where the available installation height is limited.

In an embodiment of the heat sink according to the present invention, said plurality of fluid flow channels have a common minimum width.

It is an advantage of this embodiment that it allows for the production of the plurality of channels in the slab by the same industrial processes. For example, a common minimum width of 0.1 mm renders the channels suitable for production by CNC milling etc., while a common minimum width of 0.5 mm can be obtained by metal printing with SLM.

In an embodiment of the heat sink according to the present invention, said substantially planar solid slab is provided over the surface of one of its major faces with a lid, said lid being secured by means of connecting means engaging with slab material present between said plurality of channels.

It is an advantage of this embodiment that it allows for the production of the slab with the plurality of channels by known industrial processes such as CNC milling, whereupon the channels are closed off at their open end by a lid. As the connecting means (which may comprise traditional connectors such as screws or bolts, but also adhesives and welds) engage with slab material present between the channels, these do not interfere with the cooling efficiency.

According to an aspect of the present invention, there is provided a method of producing the heat sink as described above, the method comprising: cutting to size a substantially planar solid slab from a quantity of raw material; processing said plurality of flow channels into said substantially planar solid slab to a depth less than the full thickness of said substantially planar solid slab, such that said plurality of channels includes at least two main channels interconnected by at least a plurality of bridging channels, and that said bridging channels have a cross section that locally increases in the direction of flow; and arranging a substantially planar lid onto said processed slab.

The technical effects and advantages of embodiments of the method according to the present invention correspond, mutatis mutandis, to those of the corresponding embodiments of the heat sink according to the present invention.

BRIEF DESCRIPTION OF THE FIGURES

These and other features and advantages of embodiments of the present invention will now be described in more detail with reference to the attached drawings, wherein.

DESCRIPTION OF EMBODIMENTS

As stated above, a heat sink is a physical construction that transfers heat generated by another device to a fluid medium (hereinafter also referred to as "coolant"), which is subsequently led away from the device. A liquid cold plate is essentially a heat sink through which a liquid coolant flows. The heat transfer is affected by the flow characteristics of the coolant through the channels of the liquid cold plate (e.g., whether the flow is laminar or turbulent), which will depend on the geometry of the channels, the nature of the coolant and the flow rate. Efficient heat transfer is obtained by convection in the coolant.

The inventors have found that certain novel designs of the liquid channel of the cold plate are better at meeting certain criteria, such as reduced thermal expansion, lower maximum temperature, a more uniform surface temperature, and the like. The designs according to the present invention can be adapted to meet relevant constraints, such as assembly constraints (screws), manufacturing constraints, structural integrity, and a limited pressure drop.

In general, the variations in channel cross section required by the present invention can be obtained by varying the width and/or the depth of the channels. As the present description refers to two-dimensional figures, all variations in cross section are assumed to be obtained by variations in width only; this is done for clarity purposes only and without loss of generality.

Figure 1:
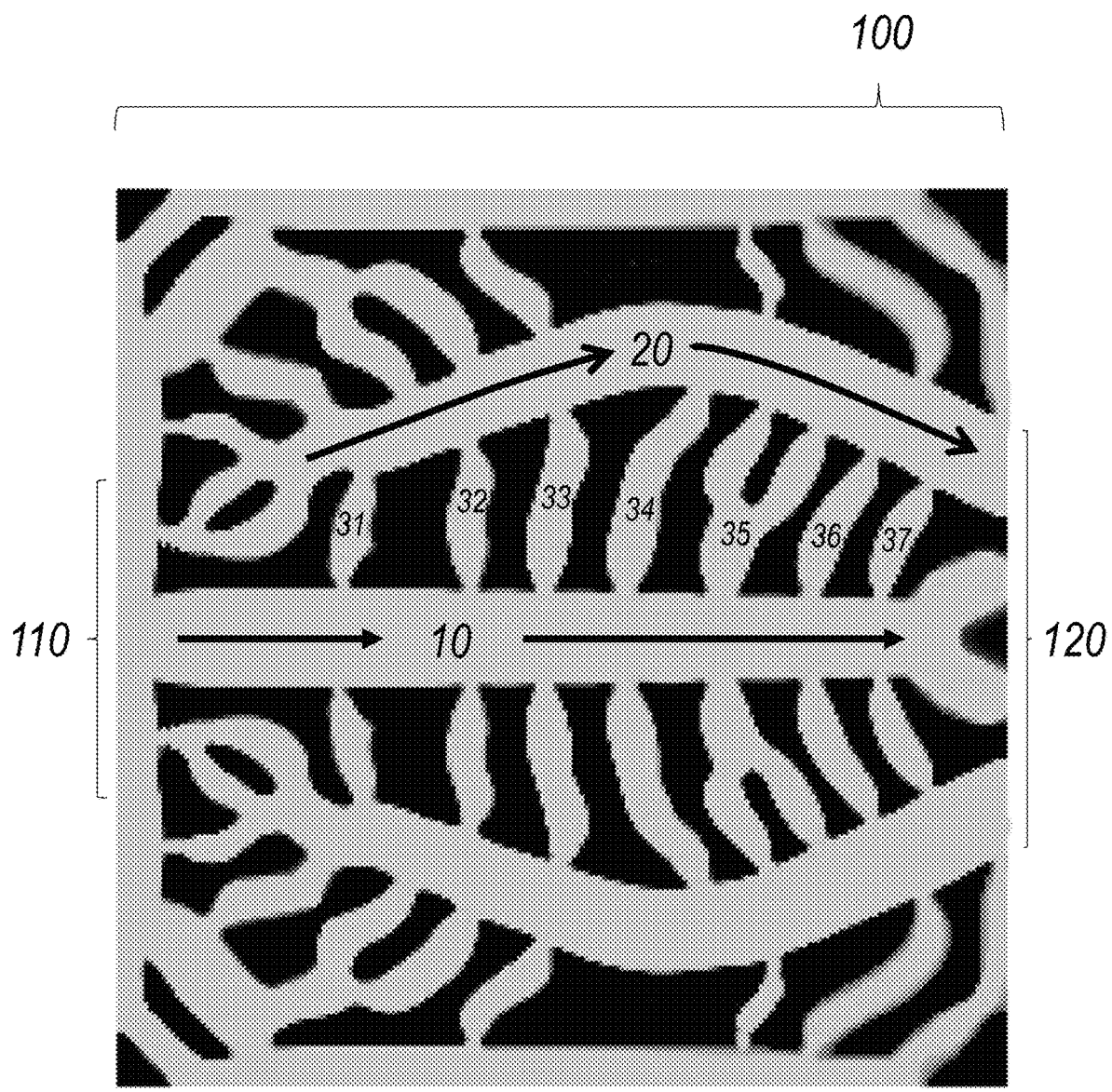
FIG. 1 presents a two-dimensional image of a first embodiment of the heat sink according to the present invention.

FIG. 1 presents a two-dimensional image of a first embodiment of the heat sink according to the present invention.

The heat sink 100 comprises a substantially planar solid slab, which is provided with a plurality of fluid flow channels. The plurality of fluid flow channels are formed so as to channel a coolant from an inlet 110 to an outlet 120 of the slab. In this embodiment, the slab is peripherally bounded by a non-permeable rim, and the inlet 110 and outlet 120 are interruptions in said rim through which coolant can enter and leave the heat sink 100, respectively. As the inlet 110 and the outlet 120 are arranged on opposite sides of the slab 101, the coolant essentially travels through the slab from left to right.

The plurality of channels includes at least two main channels 10, 20 interconnected by at least a plurality of bridging channels 31-34 and 35-37. The skilled person will observe the symmetry of the arrangement of FIG. 1 around the central horizontal axis; the counterpart of main channel 20 and of bridging channels 31-37 in the lower half of FIG. 1 have not been numbered, to keep the figure and the description concise, but their operation is of course identical.

The bridging channels 31-34 and 36-37 have a cross section that locally increases in the direction of flow (i.e., the direction from main channel 10 towards main channel 20 in the figure). Indeed, it can be seen that a local increase in cross section starts from the point of connection with the main channel 10 that is situated upstream of the bridging channels 31-34 and 36-37, thus forming a restriction at or near said connection point.

It can also be seen that the bridging channels 31-34 and 36-37 don't branch out and that they have a cross section that locally decreases in the direction of flow, downstream of the local increase in cross section. This is manifested as a second restriction, near the point of connection with the main channel 20 that is situated downstream of the bridging channels 31-34 and 36-37.

Figure 2:
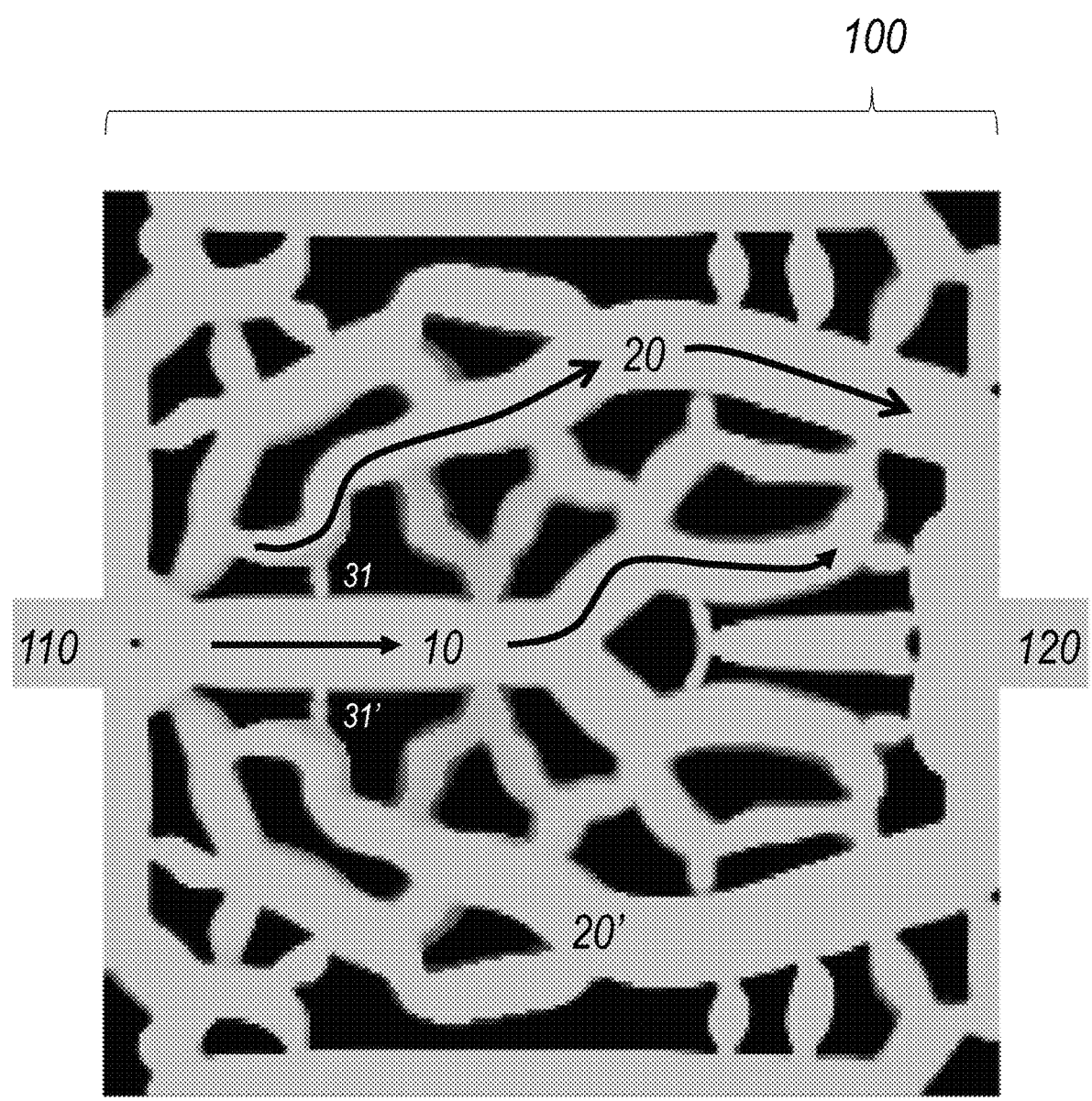
FIG. 2 presents a two-dimensional image of a second embodiment of the heat sink according to the present invention.

FIG. 2 presents a two-dimensional image of a second embodiment of the heat sink according to the present invention.

The heat sink 100 comprises a substantially planar solid slab 101, which is provided with a plurality of fluid flow channels. The plurality of fluid flow channels are formed so as to channel a coolant from an inlet 110 to an outlet 120 of the slab. In this embodiment, the slab is peripherally bounded by a non-permeable rim, and the inlet 110 and the outlet 120 are provided on the circumference of the slab 101, and provided with attachment points for fluid transport tubes or the like. As the inlet 110 and the outlet 120 are arranged on opposite sides of the slab 101, the coolant essentially travels through the slab from left to right.

The plurality of channels includes at least two main channels 10, 20, 20' interconnected by at least a plurality of bridging channels 31, 31'. The skilled person will observe the symmetry of the arrangement of FIG. 1 around the central horizontal axis.

The bridging channels 31, 31' have a cross section that locally increases in the direction of flow (i.e., the direction from main channel 10 towards main channel 20/20' in the figure). Indeed, it can be seen that a local increase in cross section starts from the point of connection with the main channel 10 that is situated upstream of the bridging channels 31, 31', thus forming a restriction at or near said connection point.

It is a feature of the embodiments illustrated in FIGS. 1 and 2 that the channels and the islands of slab material between the channels present an irregular, high-entropy pattern; i.e., apart from the symmetry imposed by the placement of the inlet and the outlet (in the illustrated cases, a symmetry around the central horizontal axis), there is no discernable regularity in the pattern. The individual islands do not exhibit multiple symmetry axes, and a lot of different island shapes tend to occur. Some islands may have wedgeshaped features directed at the oncoming flow, resulting in a branching of channels into several channels.

Figure 3:
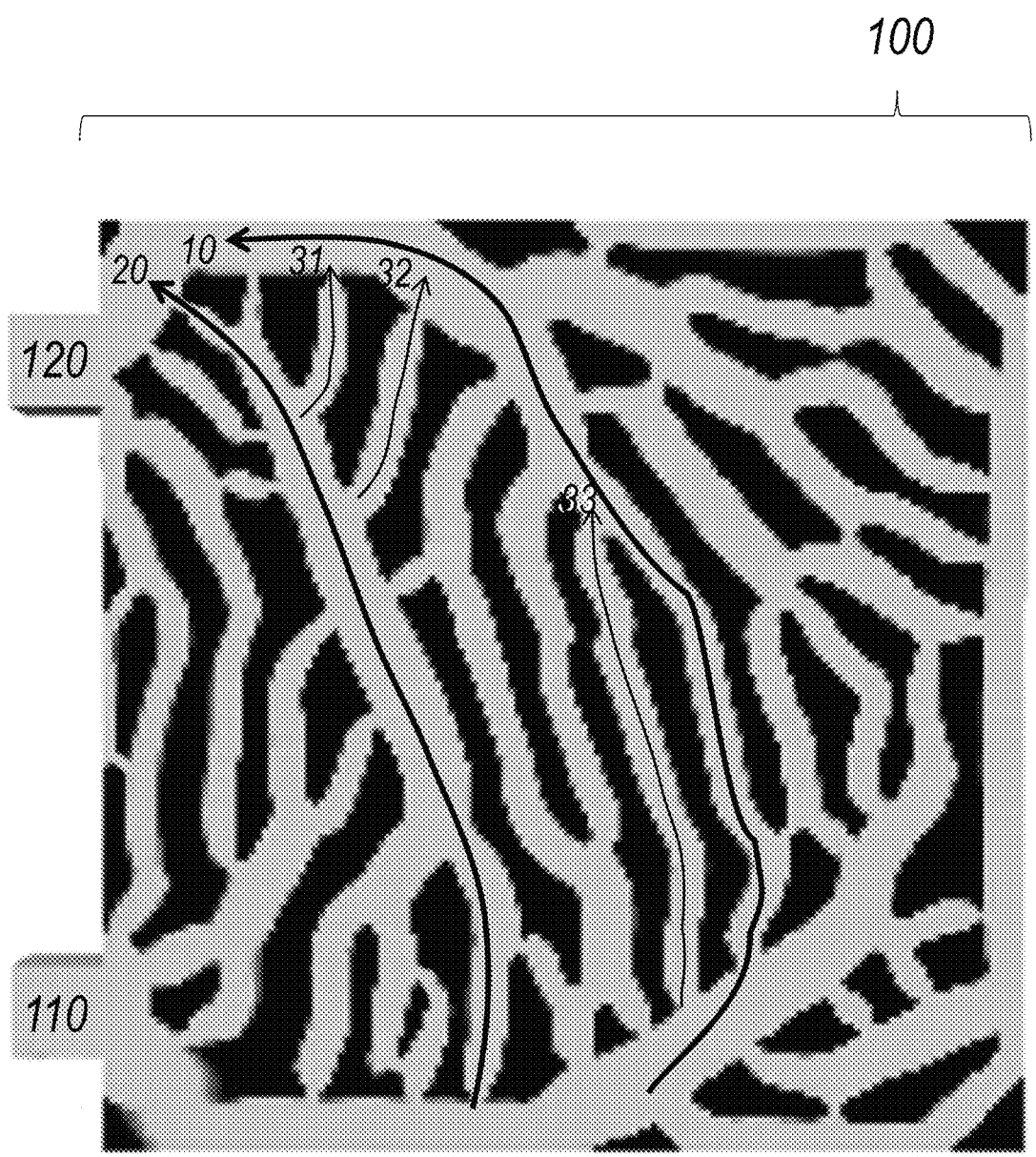
FIG. 3 presents a two-dimensional image of a third embodiment of the heat sink according to the present invention.

FIG. 3 presents a two-dimensional image of a third embodiment of the heat sink according to the present invention.

The heat sink 100 comprises a substantially planar solid slab 101, which is provided with a plurality of fluid flow channels. The plurality of fluid flow channels are formed so as to channel a coolant from an inlet 110 to an outlet 120 of the slab. In this embodiment, the slab is peripherally bounded by a non-permeable rim, and the inlet 110 and the outlet 120 are provided on the circumference of the slab 101, and provided with attachment points for fluid transport tubes or the like. As the inlet 110 and the outlet 120 are arranged on the same side of the slab 101, the coolant essentially makes a U-turn through the slab.

The plurality of channels includes at least two main channels 10, 20 interconnected by at least a plurality of bridging channels 31-33.

The bridging channels 31-33 have a cross section that locally increases in the direction of flow (i.e., the direction from main channel 10 towards main channel 20 in the figure). Indeed, it can be seen that a local increase in cross section starts from the point of connection with the main channel 10 that is situated upstream of the bridging channels 31-33, thus forming a restriction at or near said connection point.

It can also be seen that the bridging channels 31-33 don't branch out and that they have a cross section that locally decreases in the direction of flow, downstream of the local increase in cross section. This is manifested as a second restriction, near the point of connection with the main channel 20 that is situated downstream of the bridging channels 31-33.

It will be noted that there is not necessarily a single unique partition of the channel in "main channels" and "bridging channels", but there is at least one such partition in each embodiment (for example, the partition indicated in the respective figures), which meets the requirement that at least two main channels are interconnected by at least a plurality of bridging channels, wherein said bridging channels have a cross section that locally increases in the direction of flow.

Throughout the figures, only one inlet and one outlet are illustrated, but it is equally possible to have more than one inlet and/or more than one outlet. Throughout the figures, the illustrated inlet and outlet are arranged along the periphery in the plane of the slab, but it is equally possible to have one or more inlets and/or one or more outlets connecting to main faces of the heat sink.

Figure 4A:
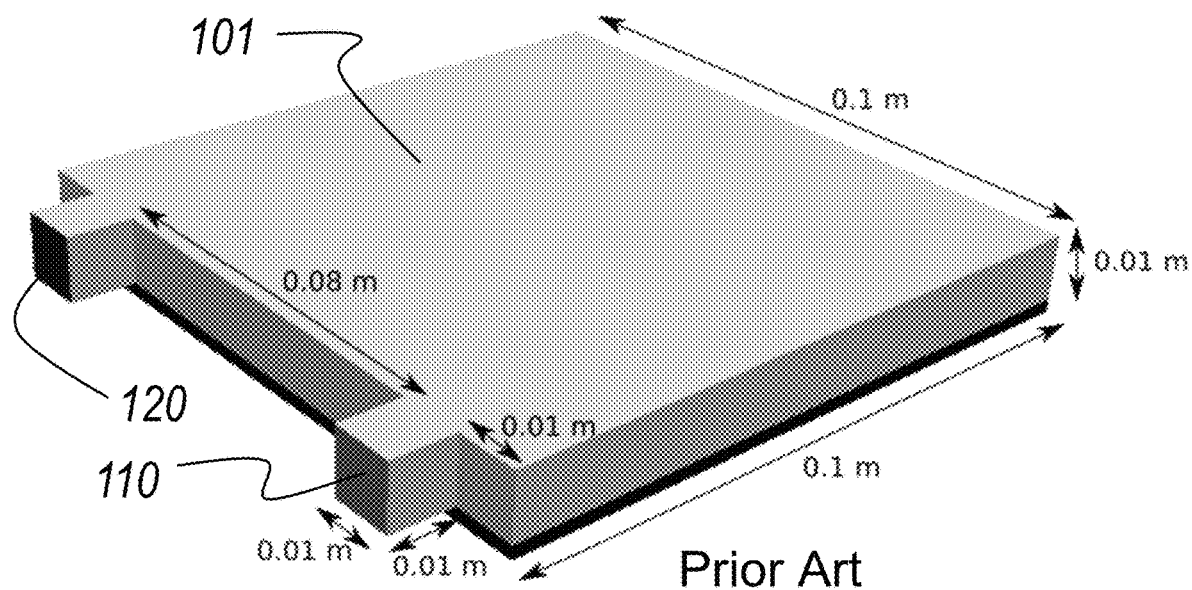
FIG. 4 presents an exemplary heat sink with a serpentine flow channel, as known from the prior art.
Figure 4B:
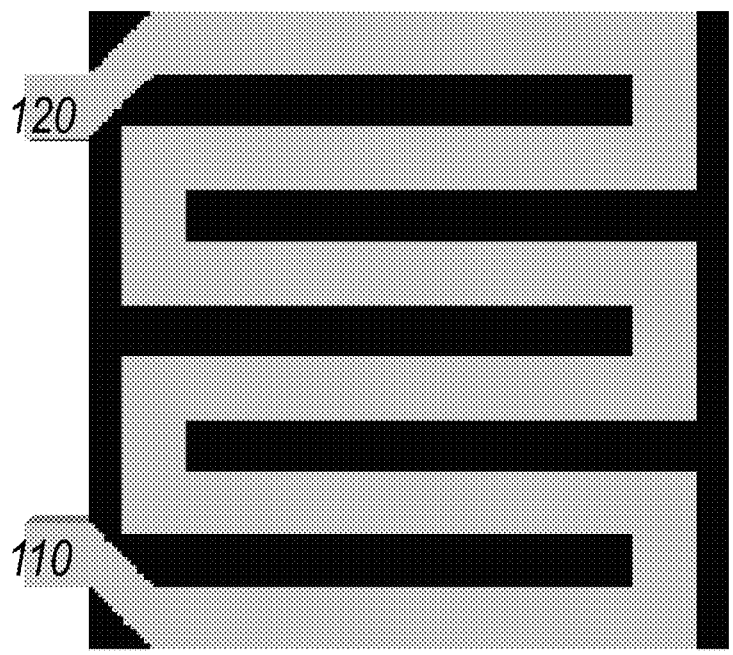

For comparison purposes, FIG. 4 presents an exemplary heat sink with a serpentine flow channel, as known from the prior art. The setup concerns a water-cooled aluminium heat sink (grey) that is mounted on a steel plate (black), which has a thickness of 0.002 m. The plate has a square shape of 10 cm×10 cm. An inlet 110 and an outlet 120 are provided on one peripheral edge of the heat sink, both having a square cross section of 1 cm×1 cm. A single, serpentine coolant channel runs from the inlet 110 to the outlet 120; it is designed so as to result in an identical amount of material as in heat sink according to the present invention illustrated in FIG. 4, namely 60.3% of material.

For the purposes of the present comparative simulation, a uniform water velocity of 0.1 m/s is imposed at the inlet side 110. The temperature of the coolant at the inlet ($T_{in}$) is assumed to be 293 K. The steel plate is heated uniformly from below with a heat flux of 10 kW/m².

Figure 5:
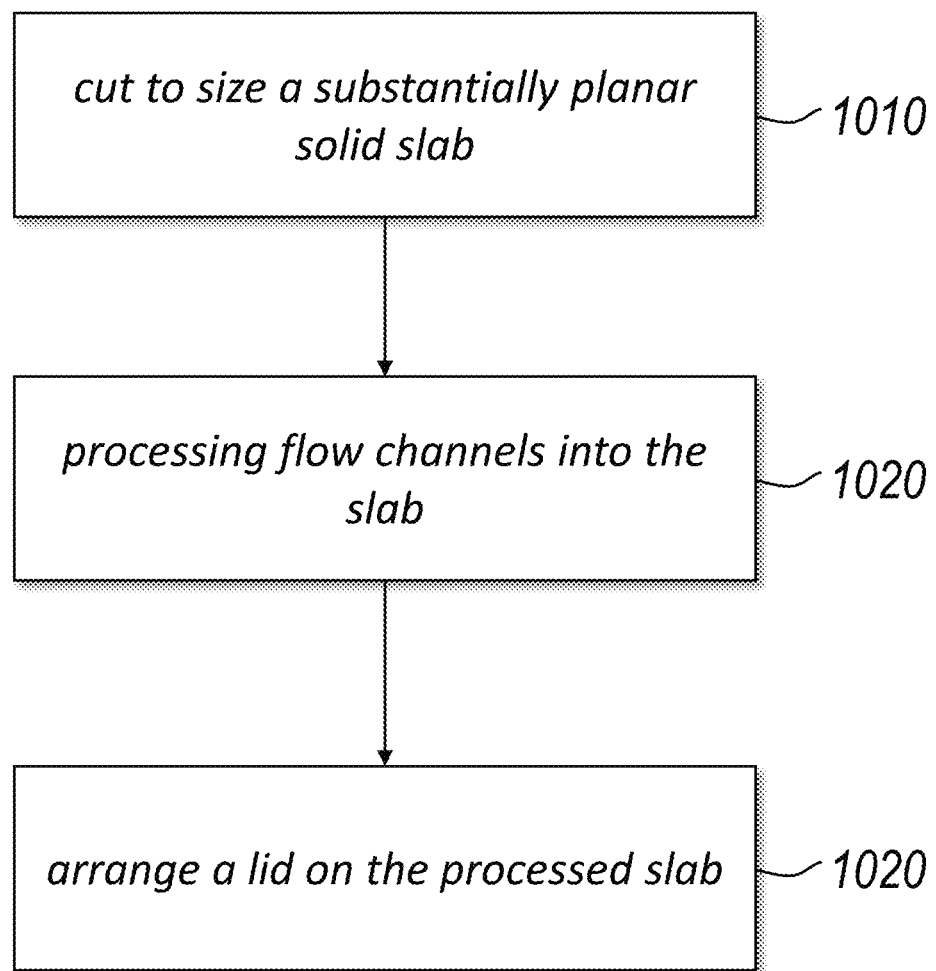
FIG. 5 presents a flow chart of an embodiment of the method according to the present invention.

The thermal performance of the designs of FIG. 4 and FIG. 5 is measured on the bottom of the steel plate, which is also the location of the heat source. The designs of FIG. 4 and FIG. 5 compare as follows:

|  | Heat Sink According to the Invention (FIG. 3) | Heat Sink according to Prior Art (FIG. 4) |
| --- | --- | --- |
| Average temperature at bottom | 313.29 K | 317.11 K |
| Thermal resistance (average) | 0.2029 K/W | 0.2411 K/W |
| Maximum temperature at bottom | 331.01 K | 340.90 K |
| Thermal resistance (maximum) | 0.3801 K/W | 0.479 K/W |
| Pressure drop | 47 kPa | 404 kPa |

It can be seen that for the same amount of heat sink material, the same coolant temperature and velocity at the inlet, and the same positioning of the inlet and the outlet, the average temperature and the maximum temperature are markedly lower for the heat sink according to the invention.

The same conclusion holds for the thermal resistance $R_{th}$, which is defined in terms of the inlet temperature $T_{in}$, the outlet temperature T and the total heat input Q (Q=qA=10 kW/m²×0.01 m²=100 W), such that:

$$R_{th}=(T-T_{in})/Q$$

The pressure drop observed over the heat sink according to the invention is almost an order of magnitude lower than the pressure drop observed over the heat sink according to the prior art; this difference has important techno-economical benefits, as it means that a smaller (cheaper) coolant pump can be used to obtain better cooling.

The heat sink according to the present invention, in particular the channels in the substantially planar slab, may be produced by milling, laser cutting, etching, 3D printing, sheet metal plate forming (for example die forming and hydroforming) and other known production methods. It is particularly advantageous to design the heat sink 100 according to the present invention in such a way that the plurality of fluid flow channels have a common minimum width, which is adapted to the manufacturing technology.

A particular method of producing the heat sink 100 according to the present invention, is illustrated in FIG. 5. The method comprises cutting to size 1010 a substantially planar solid slab 101 from a quantity of raw material, to obtain the desired shape. While many heat sinks are rectangular, other shapes are also possible. The plurality of flow channels is processed 1020 into the substantially planar solid slab to a depth less than the full thickness of the substantially planar solid slab, such that the plurality of channels includes at least two main channels 10, 20 interconnected by at least a plurality of bridging channels 31-37, and that the bridging channels have a cross section that locally increases in the direction of flow. Finally, a substantially planar lid 102 is arranged 1030 onto the processed slab 101.

While the invention has been described hereinabove with reference to specific embodiments, this was done to clarify and not to limit the invention, the scope of which is to be determined by reference to the attached claims. It is also noted that the concepts described herein may be applied, with like effect, to heat exchangers.

The invention claimed is:

1. A heat sink comprising a substantially planar solid slab, provided with a plurality of fluid flow channels, said plurality of fluid flow channels being formed so as to channel a coolant in a direction of flow from an inlet to an outlet of said slab, wherein said plurality of channels includes at least two main channels interconnected by at least a plurality of bridging channels that do not branch out further between their respective points of attachment to said main channels;

wherein said bridging channels have a cross section that locally increases in the direction of flow; and wherein said bridging channels have a cross section that locally decreases in the direction of flow, downstream of said local increase in cross section.

2. The heat sink according to claim 1, wherein said main channels have a minimum cross section that is greater than a maximum cross section of its bridging channels.

3. The heat sink according to claim 1, wherein said main channels follow a substantially straight trajectory for at least ⅓ of a length of the outer dimension of the heat sink in the direction of flow.

4. The heat sink according to claim 2, wherein said main channels follow a substantially straight trajectory for at least ⅓ of a length of the outer dimension of the heat sink in the direction of flow.

5. The heat sink according to claim 1, wherein said local increase in cross section starts from the point of connection with one of said main channels that is upstream of said bridging channel.

6. The heat sink according to claim 3, wherein said local increase in cross section starts from the point of connection with one of said main channels that is situated upstream of said bridging channel.

7. The heat sink according to claim 1, wherein plural portions of said solid slab remaining between said fluid flow channels form islands that do not exhibit multiple symmetry axes, and wherein different island shapes occur.

8. The heat sink according to claim 3, wherein plural portions of said solid slab remaining between said fluid flow channels form islands that do not exhibit multiple symmetry axes, and wherein different island shapes occur.

9. The heat sink according to claim 1, wherein said inlet and/or said outlet are provided on the circumference of said slab.

10. The heat sink according to claim 4, wherein said inlet and/or said outlet are provided on the circumference of said slab.

11. The heat sink according to claim 1, wherein said plurality of fluid flow channels have a common minimum width.

12. The heat sink according to claim 3, wherein said plurality of fluid flow channels have a common minimum width.

13. The heat sink according to claim 1, wherein said substantially planar solid slab is provided over a surface of one of its major faces with a lid, said lid being secured by means of connecting means engaging with portions of said slab present between said plurality of channels.

14. The heat sink according to claim 3, wherein said substantially planar solid slab is provided over the a surface of one of its major faces with a lid, said lid being secured by means of connecting means engaging with portions of said slab present between said plurality of channels.

15. The heat sink according to claims 5 wherein said substantially planar solid slab is provided over a surface of one of its major faces with a lid, said lid being secured by means of connecting means engaging with portions of said slab present between said plurality of channels.

16. The heat sink according to claim 7, wherein said substantially planar solid slab is provided over a surface of one of its major faces with a lid, said lid being secured by means of connecting means engaging with portions of said slab present between said plurality of channels.

17. A method of producing the heat sink according to claim 1, the method comprising:

cutting to size a substantially planar solid slab from a quantity of raw material;

processing said plurality of flow channels into said substantially planar solid slab to a depth less than the full thickness of said substantially planar solid slab, such that said plurality of channels includes at least two main channels interconnected by at least a plurality of bridging channels, and that where said bridging channels have a cross section that locally increases in the direction of flow; and arranging a substantially planar lid onto said processed slab.

18. The heat sink according to claim 1, wherein said main channels follow a substantially straight trajectory for at least ½ of a length of the outer dimension of the heat sink in the direction of flow.

19. The heat sink according to claim 1, wherein said main channels follow a substantially straight trajectory for at least ⅔ of a length of the outer dimension of the heat sink in the direction of flow.

20. The heat sink according to claim 1, wherein said main channels follow a substantially straight trajectory for at least ¾ of a length of the outer dimension of the heat sink in the direction of flow.

21. The heat sink according to claim 2, wherein said main channels follow a substantially straight trajectory for at least ½ of a length of the outer dimension of the heat sink in the direction of flow.

22. The heat sink according to claim 2, wherein said main channels follow a substantially straight trajectory for at least ⅔ of a length of the outer dimension of the heat sink in the direction of flow.

23. The heat sink according to claim 2, wherein said main channels follow a substantially straight trajectory for at least ¾ of a length of the outer dimension of the heat sink in the direction of flow.

* * * * *